(12) United States Patent
    Ge

(10) Patent No.: US 9,891,257 B2
(45) Date of Patent: Feb. 13, 2018

(54) TESTING SYSTEM AND METHOD USING ELECTROMAGNETIC NEAR FIELD MEASUREMENTS

(71) Applicant: HAND HELD PRODUCTS, INC., Fort Mill, SC (US)

(72) Inventor: Fengyu Ge, Cedar Rapids, IA (US)

(73) Assignee: HAND HELD PRODUCTS, INC., Fort Mill, SC (US)

( * ) Notice: Subject to any disclaimer, the term of this patent is extended or adjusted under 35 U.S.C. 154(b) by 366 days.

(21) Appl. No.: 14/452,951

(22) Filed: Aug. 6, 2014

(65) Prior Publication Data

US 2016/0041214 A1  Feb. 11, 2016

(51) Int. Cl.
    *G01R 27/04*  (2006.01)
    *G01R 29/10*  (2006.01)
    *H03J 1/00*   (2006.01)

(52) U.S. Cl.
    CPC ............ *G01R 29/10* (2013.01); *H03J 1/0008* (2013.01); *H03J 2200/06* (2013.01)

(58) Field of Classification Search
    CPC .... G01R 29/10; G01R 27/32; G01R 29/0814; G01R 23/00; G01R 27/04; G01N 22/04; G01K 11/006; H04B 17/0057
    USPC ........................................................ 324/637
    See application file for complete search history.

(56) References Cited

U.S. PATENT DOCUMENTS

| 2006/0287596 | A1* | 12/2006 | Johnson | A61B 5/4312 |
| | | | | 600/437 |
| 2012/0001628 | A1* | 1/2012 | Weatherall | G01V 3/12 |
| | | | | 324/300 |
| 2012/0289827 | A1* | 11/2012 | Ismail | A61B 5/05 |
| | | | | 600/430 |
| 2012/0296204 | A1* | 11/2012 | Ismail | A61B 5/4312 |
| | | | | 600/430 |
| 2014/0210472 | A1* | 7/2014 | Homann | G01R 33/36 |
| | | | | 324/309 |
| 2015/0015275 | A1* | 1/2015 | Huang | G01M 5/0083 |
| | | | | 324/633 |
| 2015/0054679 | A1* | 2/2015 | Ahmed | G01S 7/411 |
| | | | | 342/25 A |
| 2015/0153319 | A1* | 6/2015 | Shapiro | G01N 33/483 |
| | | | | 324/207.11 |
| 2015/0301139 | A1* | 10/2015 | Shames | G01N 24/08 |
| | | | | 324/309 |

* cited by examiner

*Primary Examiner* — Thang Le
(74) *Attorney, Agent, or Firm* — Oliff PLC; R. Brian Drozd

(57) ABSTRACT

A system, method and computer readable medium are provided. One system includes a transmit antenna, at least one receive antenna, and a controller configured to operate the transmit antenna and the at least one receive antenna to acquire coupled signal information from a device under test. The system also includes a processor configured to approximate a shape of a structure within the device under test using changes in resonance determined from the coupled reflected signal information and caused by different materials forming the structure.

20 Claims, 10 Drawing Sheets

TESTING SYSTEM AND METHOD USING ELECTROMAGNETIC NEAR FIELD MEASUREMENTS

BACKGROUND

Handheld or mobile computers are widely used, such as in different field mobility environments. For example, these computing devices may be used by mobile field service and transportation workers to allow different types of mobile operations, such as in-field computing, barcode scanning, and communication with remote external devices, among others. These devices are becoming increasingly more advanced and include additional functionality for use in different operating environment.

These computing devices typically include communication systems configured for operation in a particular area. For example, one or more different antenna arrangements or configurations may be provided for wireless communication using these devices. The antenna configurations may include different shapes or sizes of antenna that are designed to communicate over particular frequency bands. Thus, an antenna optimized for communication in a particular region (e.g., communication using U.S. frequency bands) may not operate well, or at all, in other regions (e.g., communication using European or South American frequency bands).

It is often difficult, and sometimes not possible (such as when an antenna is installed in an assembled housing) to determine whether an improper antenna has been installed within a particular device. For example, due to inexperience or inability to view an installed antenna, determining manufacturing and assembly issues with the antenna can be very challenging, such as when the wrong antenna is installed within a device (e.g., European antenna installed in a device to be used in the U.S.). Without opening the device to visually identify the antenna that is installed, complex and expensive testing equipment, such as Vector Network Analyzers (VNAs) must be used.

Thus, there is needed a way to efficiently and accurately determine the type of antenna installed within a device or other structures within the device without opening the device or using expensive test equipment.

SUMMARY

To overcome these and other challenges, aspects of broad inventive principles are disclosed herein.

In one embodiment, a system is provided that includes a transmit antenna, at least one receive antenna, and a controller configured to operate the transmit antenna and the at least one receive antenna to acquire coupled signal information (e.g., electromagnetically coupled signal power) from a device under test. The system also includes a processor configured to approximate a shape of a structure within the device under test using changes in resonance determined from the acquired coupled signal information caused by different materials forming the structure.

In another embodiment, a method for determining a shape of a structure is provided. The method includes measuring coupled signal power from a receive antenna, wherein the coupled signal power is measured in an electromagnetic (EM) near field, and determining detuning effects from the received coupled signal power. The method also includes identifying materials causing the detuning effects and approximating a shape of the structure of interest using the identified materials.

In another embodiment, a computer-readable storage medium includes executable instructions capable of configuring one or more processors for measuring received power of coupled signals from an antenna in proximity to a structure of interest, wherein the coupled signals are measured in an electromagnetic (EM) near field, and determining detuning effects based on the received power of the coupled signals. The computer-readable storage medium further includes executable instructions capable of configuring one or more processors for identifying materials causing the detuning effects and approximating a shape of the structure of interest using the identified materials.

DETAILED DESCRIPTION

Figure 1:
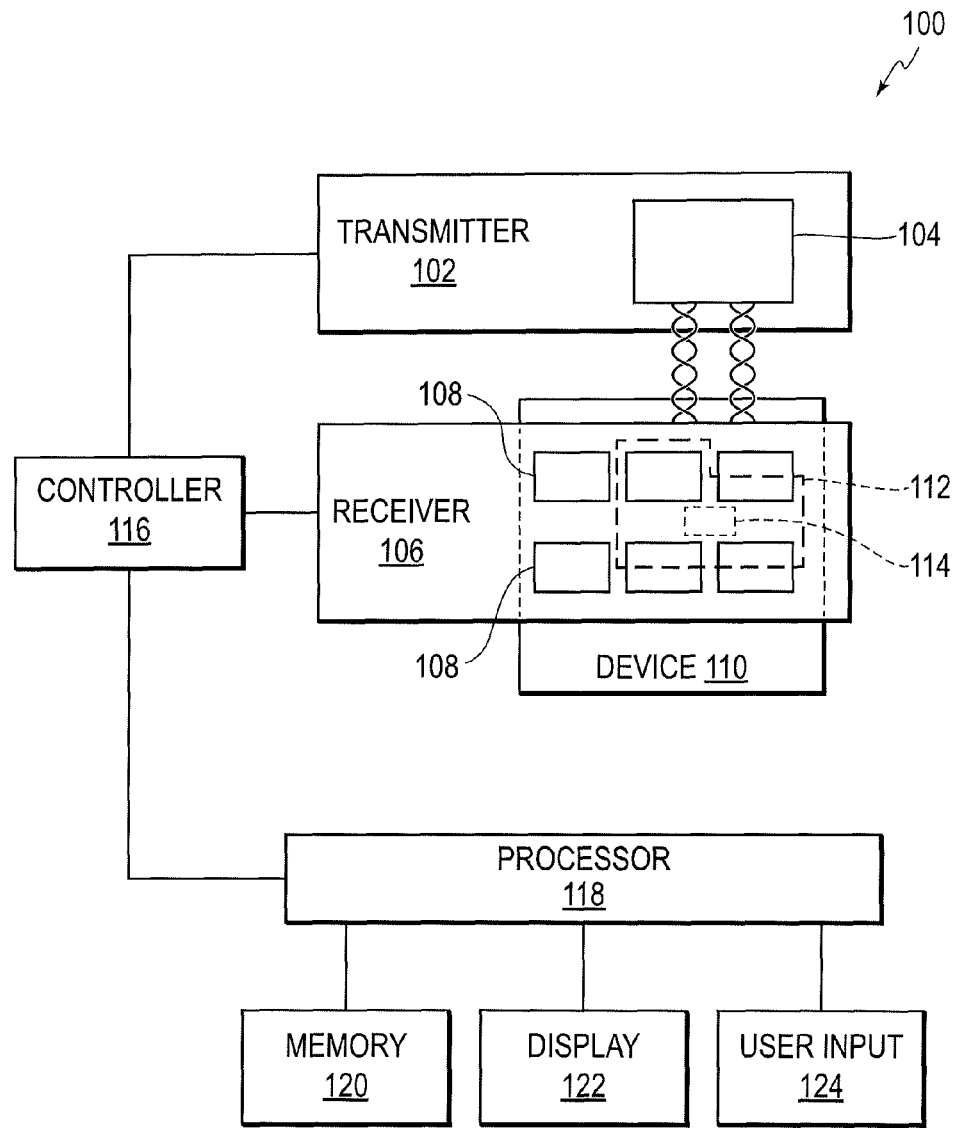
FIG. 1 is a block diagram illustrating a testing system in accordance with an embodiment.

The exemplary embodiments described herein provide detail for illustrative purposes and are subject to many variations in structure and design. It should be appreciated, however, that the embodiments are not limited to a particularly disclosed embodiment shown or described. It is understood that various omissions and substitutions of equivalents are contemplated as circumstances may suggest or render expedient, but these are intended to cover the application or implementation without departing from the spirit or scope of the claims. Also, it is to be understood that the phraseology and terminology used herein is for the purpose of description and should not be regarded as limiting. The terms "a," "an," and "the" herein do not denote a limitation of quantity, but rather denote the presence of at least one of the referenced object. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, as will be appreciated by one skilled in the art, aspects of the present disclosure may be embodied as a system, method, or computer program product. Accordingly, aspects of various embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." In addition, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM) or similar DVD-ROM and BD-ROM, an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for one or more embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

At least some of the present disclosure is described below with reference to flowchart illustrations and/or block diagrams of methods, apparatus (systems) and computer program products according to embodiments described herein. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Handheld or portable computing devices can be used in many different applications. Accordingly, while various embodiments may be described in connection with testing or verifying components for a device for use in a particular environment, the various embodiments are not so limited. For example, various embodiments may be used to test or verify different communication components within a device, such as different antenna arrangements, as well as other structures therein.

When manufacturing and assembling computing devices, such as handheld or portable computing devices, different types of antenna may be installed within different configurations of the handheld or portable computing devices. For example, different antennas are used for communication in different areas (e.g., U.S., Europe, South America, etc.) During assembly, a wrong type of antenna may be installed or wiring in the wrong orientation may be connected within the handheld or portable computing devices. For example, due to different factors, such as lack of experience or fatigue, an assembler may install the incorrect antenna within a particular handheld or portable computing device. As such, a device configured to operate in one region having particular operating frequency band requirements may have installed therein an antenna configured to operate in another region having different operating frequency band requirements. As a result, the device may not operate or perform sub-optimally, resulting in the return or exchange of the device.

Some embodiments of the present application describe systems and methods to test or verify the internal configuration of a device, such as the configuration of one or more antennas installed within the device. In one embodiment, one or more electromagnetic (EM) probes operating using near-field EM transmissions are configured to scan a device (e.g., product) under test to determine the configuration or arrangement of components in the device. The resonance frequency and magnitude of the EM probe varies when in proximity to material of different dielectric properties. The systems and methods monitor the resonance changes to estimate the material properties in proximity to the probe. In some embodiments, a system includes a set of EM probes to scan a device and determine certain properties and characteristics of the components within the device, such as of different metal structures (e.g., antennas). Thus, a user can verify or confirm, for example, the type of antenna or wiring arrangement within the device. In some embodiments, the verification or confirmation identifies manufacturing or assembly defects of the device without opening the device or powering on the device.

It should be noted that the testing or scanning system and the device under test are referred to herein for ease of illustration. However, it should be understood that the system and device under test may be configured as any type of testing apparatus for use in testing or scanning different devices.

One embodiment of a testing system 100 is shown in FIG. 1. The testing system can comprise a transmitter 102 having one or more transmit antennas 104 and a receiver 106 having one or more receive antennas 108. It should be noted that although one transmit antenna 104 and six receive antennas 108 are illustrated, the system 100 can comprise additional transmit or receive antennas 104, 108 or fewer receive antennas 108. In one or more embodiments, the receive antennas 108 are arranged in an array, which may be symmetrical or asymmetrical. For example, although the receive antennas 108 are shown in a generally rectangular array configuration, the receive antennas 108 may be arranged or aligned to form different sized and shaped arrays as desired or need, such as based on the device under test. In various embodiments, the receive antennas 108 in combination with the transmit antenna 104 can form one or more EM probes to verify manufacturing and/or assembling defects or issues. In some embodiments, such as when used in field offices or service departments, technicians can use the testing system 100 to scan a product and determine if radio performance degradation is caused by antenna failure. In other embodiments, the testing system 100 can be used to scan wire routing inside the plastic housing of a product.

The receive antennas 108 are positioned in proximity to a device 110, such as a product under test that includes an area of interest 112 (illustrated in dashed line corresponding to an antenna installed within the device 110). As described in more detail herein, by positioning the array of receive antennas 108 in proximity to the area of interest 112 (illustrated as adjacent to and over the area of interest 112), the dielectric properties of the material in proximity to each of the receive antennas 108 can be estimated. Using the estimation of the dielectric properties, a rough approximation of the shape of the material can be determined, such as corresponding to the shape of a particular antenna 114 within the device 110.

In some embodiments, different arrangements of receive antennas 108 may be provided depending on the particular components to be scanned within the device 110. In one embodiment, the receive antennas 108 are arranged based on the expected shape or configuration of the different types of antennas 114 that may be present within the device 110. In this way, the receive antennas 108 can be used to estimate the dielectric property of the material of the antenna 114 within the device 110 to determine the approximate shape of the antenna 114. By determining the approximate shape of the antenna 114, verification or confirmation that the correct antenna is installed with the device 110 may be performed, such as by matching the expected shape to the estimated shape. It should be noted that in some embodiments the matching process may be performed manually by a user comparing the determined estimated shape of an antenna 114 to defined known shapes of antenna that may have been installed in the device 100. In other embodiments, the matching process may be performed automatically using a shape matching process using shape templates corresponding to known antenna configurations. In these embodiments, user verification may be performed by visually confirming the match. In still other embodiments, a semi-automatic process may be performed that includes user intervention during the matching, such as modifying particular borders of an estimated shape to determine a match.

It should be noted that in some embodiments, if a match is not found, notification may be provided. For example, in such a case, the system 100 may be improperly operating or the antenna 114 may be completely incorrect, such as being an antenna for installation in an entirely different product.

The testing system 100 can also comprise a controller 116 coupled to the transmitter 102 and receiver 106. It should be noted that any type of communicative or operative coupling may be used, such as any type of wireless or wired communication. The controller 116 is configured to control the operation of the transmitter 102 and receiver 106, such as to control the transmissions by the transmit antenna 104 and the reception by the receive antennas 108. In one embodiment, the controller 116 is a transmit and receive controller configured to control the radio-frequency (RF) pulses sent to the transmit antenna 102 and the communication of signals received by the receive antennas 108.

The testing device 118 can further comprise a processor 118 coupled to the controller 116. As described in more detail herein, the processor 118 can control the operation of the controller 116 to transmit and receive as desired or needed. The processor 118 is also configured in various embodiments to process received signal information, such as to determine and monitor the resonance changes in the signals received by the receive antennas 108 to estimate the material properties in proximity to each of the receive antennas 108. Additionally, a memory 120, which may be any type of electronic storage device, can be coupled to the processor 118 (or form part of the processor 118). The processor 118 may access the memory 120 to obtain antenna configuration information that can be used to verify the type of antenna 114 within the device 110, which may be performed manually, automatically, or semi-automatically as described herein.

The testing system 100 can comprise a display 122 and user input device 124 coupled to the processor 118 to allow user interaction with the testing system 100. For example, the display 122 can allow visual confirmation or user guidance to confirm the type of antenna 114 within the device 110, which may include receiving one or more user inputs at the user input device 124 (e.g., keyboard, mouse, touchpad, etc.). In some embodiments, the display 122 and user input device 124 may be integrated, such as in a touchscreen display device.

While FIG. 1 illustrates a particular connection arrangement of the various components, a skilled artisan would appreciate the fact that other connection arrangements may be made that are within the scope of this disclosure. Additionally, the various components may be housed within the same or different physical units and the separation of components within FIG. 1 is merely for illustration.

The testing system 100 can also comprise one or more communication subsystems to allow communication with external devices, such as networks, printers, etc. Thus, additional components may form part of or communicate with the testing system 100.

Figure 2:
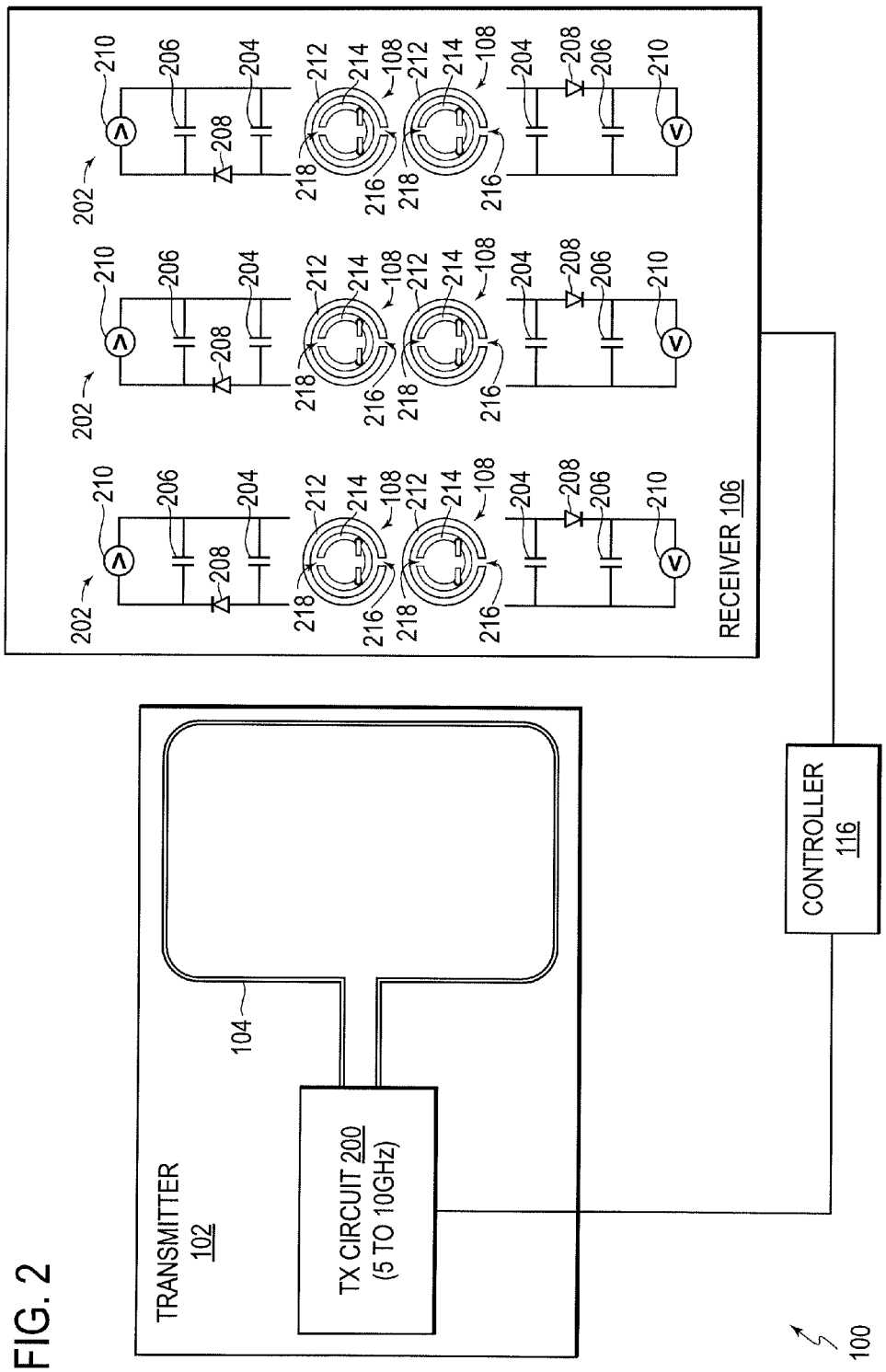
FIG. 2 is a schematic diagram of a testing system in accordance with one embodiment.

FIG. 2 schematically illustrates one embodiment of a portion of the testing system 100 (generally showing the data acquisition portion). In the various embodiments, like numerals represent like parts. As illustrated in FIG. 2, the transmitter 102 can comprise a transmit circuit 200 coupled to the transmit antenna 104. The transmit circuit 200 is configured to operate within a defined frequency range to generate RF pulses for transmission by the transmit antenna 104. For example, in one embodiment, the transmit circuit 200 is configured to operate in the 5 GHz to 10 GHz frequency range. However, it should be appreciated that the transmit circuit 200 can be configured to operate at different frequency ranges that may or may not overlap with the 5 GHz to 10 GHz frequency range. The transmit circuit 200 may be any type of circuit capable of generating pulses for transmission by the transmit antenna 104. For example, the transmit circuit 200 can be configured to generate RF pulses based on the configuration of the transmit antenna 104 or the particular application, such as the device 110 to be tested. The transmit source 200 in some embodiments is a power source that transmits RF pulses to the transmit antenna 104.

It should be noted that although the transmit antenna 104 is illustrated as a loop antenna, different shapes and sizes of transmit antennas may be used. Additionally, the relative positioning of the transmit antenna 104 to the receive antennas 108 is merely for illustration.

The receiver 106 can comprises a plurality of tuning circuits 202 illustrated as connected to a respective or corresponding antenna 108 (e.g., patch antenna). In the illustrated embodiment, each of the tuning circuits 202 can comprise a pair of parallel connected capacitors 204, 206 that define a resonance range for use in monitoring the resonance changes of received signals due to the detuning effects from the device 106. Each of the tuning circuits 202 can comprise a diode 208 connected between the pair of capacitors 204, 206. The diode 208 acts as a rectifier to covert the received RF energy (alternating signal) from the RF coupled signals to a DC signal.

Each of the tuning circuits 202 can also comprise a voltmeter 210 connected is parallel with the pair of capacitors 204, 206. The voltmeter 210 is configured to receive and measure the rectified DC signal from the diode 208. For example, in illustrated arrangement, the voltmeter 210 is configured to output the measured power of the RF signal received by the receive antennas 108. Accordingly, each of the voltmeters 210 outputs a measured value corresponding to the received power of the antennas from a particular scanned region or the area of interest 112 (shown in FIG. 1). It should be noted, as discussed in more detail herein, various embodiments, in addition to determining the coupled signal power, also determine a frequency shift in the resonance circuit coupled signals.

The receive antenna 108 can comprise concentric antenna elements 212, 214 having aligned gaps 216, 218 respectively spaced 180 degrees apart on each of the antenna elements 212, 214. It should be noted that the size and spacing of the antenna elements 212, 214, as well as the gaps 216, 218 may be varied as desired or needed. Additionally, different types of antenna arrangements and elements may be used and the concentric antenna elements 212, 214 are shown merely for illustration. For example, the concentric antenna elements 212, 214 in some embodiments are configured to use near-field EM to determine material dielectric properties. However, the detuning effects of other materials may be measured in other embodiments, such as of various materials typically forming an antenna for radio communication.

Figure 5:
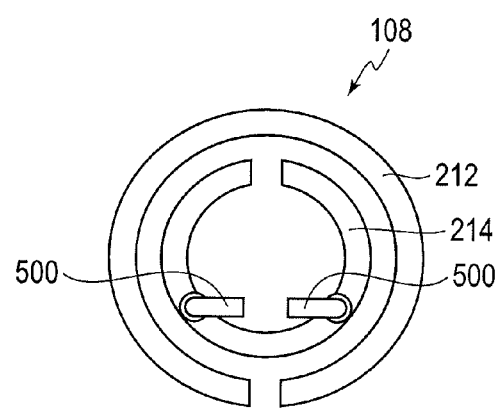
FIG. 5 is a diagram illustrating a receive antenna in accordance with an embodiment.

In one embodiment, the antenna element 214 includes connectors 500 (shown in FIG. 5) that allow for connection to the tuning circuits 202. It should be appreciated that different connectors and different positions of connectors may be implemented in one or more embodiments, and the connectors 500 are shown merely for illustration.

Figure 4:
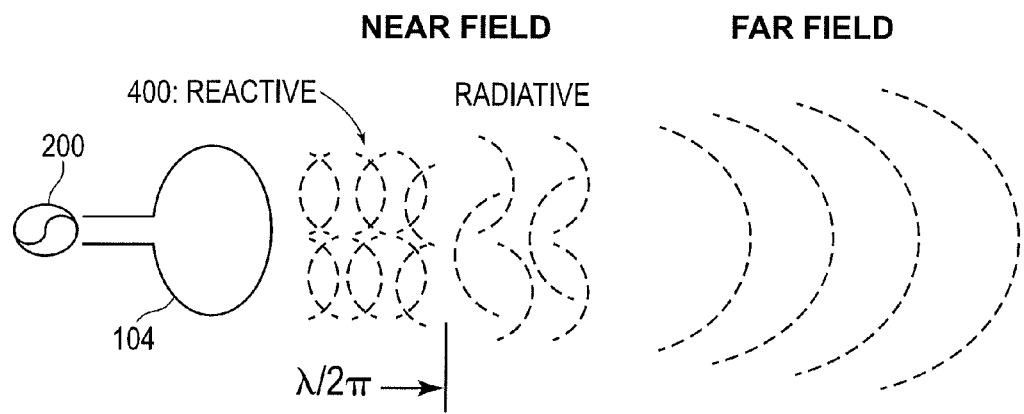
FIG. 4 is an illustration of electromagnetic energy.

In various embodiments, the testing system 100, such as may be configured as a probe, becomes part of the antenna structure in the near field. For example, due to the reactive EM near field 400 (shown in FIG. 4), the receive antenna 108 positioned in proximity to the device (110 shown in FIG. 1) becomes part of the antenna structure of the antenna 114 within the device 110. In particular, the device 110 under test becomes part of the overall antenna structure.

The antenna structure formed by the combination of the testing system 100 and the antenna 114 define a resonant structure that transfers guided wave to radiation. In the near-field, dielectric or metallic material changes the resonance of the antenna structure, namely detuning the antenna structure. The testing system 100 determines the different detuning effects caused by different materials in the device 110 to identify or verify different structural properties or characteristics of interest. For example, metallic and magnetic materials within the device 100 have the strongest detuning effects. Various embodiments, instead of measuring noise, measure the coupled power and/or frequency shift of the resonance to determine the detuning effects, which allows for identifying or verifying different structural properties or characteristics of interest, such as the shape of the antenna 114 within the device 110 (both shown in FIG. 1).

Figure 3:
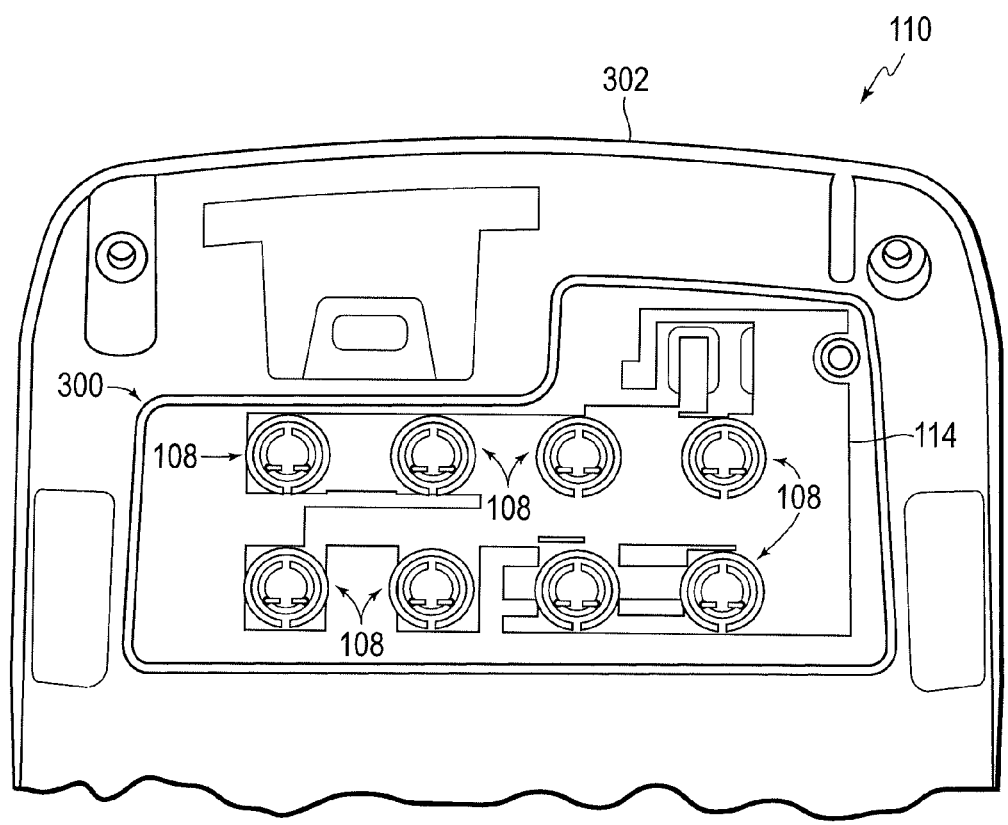
FIG. 3 is a diagram illustrating a testing system in combination with a device under test in accordance with an embodiment.

FIG. 3 illustrates a probe 300 of one embodiment positioned in proximity to a portion of the device 110. The probe 300 can comprise a plurality of the receive antennas 108 within a housing that can be positioned, for example, along or in contact with the housing 302 of the device 110 (illustrated as a rear upper housing of the device 110 in FIG. 3). However, the probe 300 may be positioned at different locations of the device 100. In this embodiment, the probe 300 is positioned in proximity to a known location of the antenna 114 (shown in dashed lines) of the device 110. The shape of the antenna 114, once approximately determined, may be used to identify the type of antenna 114.

As can be seen in the illustrated embodiment, each of the receive antennas 108 is positioned adjacent a different portion of the antenna 114 due to the spaced apart relationship of the receive antennas 108. The spacing and arrangement of the receive antennas 108 may be varied to provide different coverage areas as described in more detail herein. For example, instead of aligned rows of receive antennas 108, the receive antennas 108 in each row (top and bottom rows as viewed in FIG. 3) may be alternatingly offset from an adjacent receive antenna 108. In some embodiments, a stepwise arrangement of the receive antennas 108 may be provided. As should be appreciated by the skilled artisan, different antenna configurations and arrangements are encompassed by this disclosure.

As can be seen in FIG. 3, some of the receive antennas 108 cover all of a portion of the antenna 114, while other cover only a portion of the antenna 114, and one (the bottom left receive antenna 108 in FIG. 3) does not cover any portion of the antenna 114. As a result of the different positions of the receive antennas 108 and the materials thereunder or adjacent thereto that have different dielectric properties, such as metallic and magnetic materials, as well non-metallic and non-magnetic materials, different resonance changes may be measured. In operation, the differences in the dielectric properties of the materials are measured using the receive antennas 108 based on a difference in receive power of coupled signals. Using the difference in received power, and optionally a frequency shift, an approximate or rough shape of the object of interest, in this example the antenna 114, within the device 100 can be determined. For example, different shaped portions of the antenna 114 cause resonance at different frequencies that can be detected using the testing system 100 (shown in FIG. 1).

As discussed in more detail herein, by measuring the received power by the array of receive antennas 108, wherein one or more of the receive antennas 108 has a different received power due to the dielectric properties of materials in proximity to the particular receive antenna 108, the estimated dielectric property of the materials may be determined. Using this information, which may also include a determination of different resonance frequencies (resulting from different shaped materials in proximity to the receive antennas 108), an approximate or rough shape of the structure defined by the materials may be determined. For example, different shaped elements cause resonance at different frequencies. Thus, in some embodiments, using a priori information (e.g., empirical testing data) of the resonance frequencies caused by different materials, the approximate or rough shape of the antenna 114 within the device 100 may be determined by identifying the locations of the materials.

Figure 6:
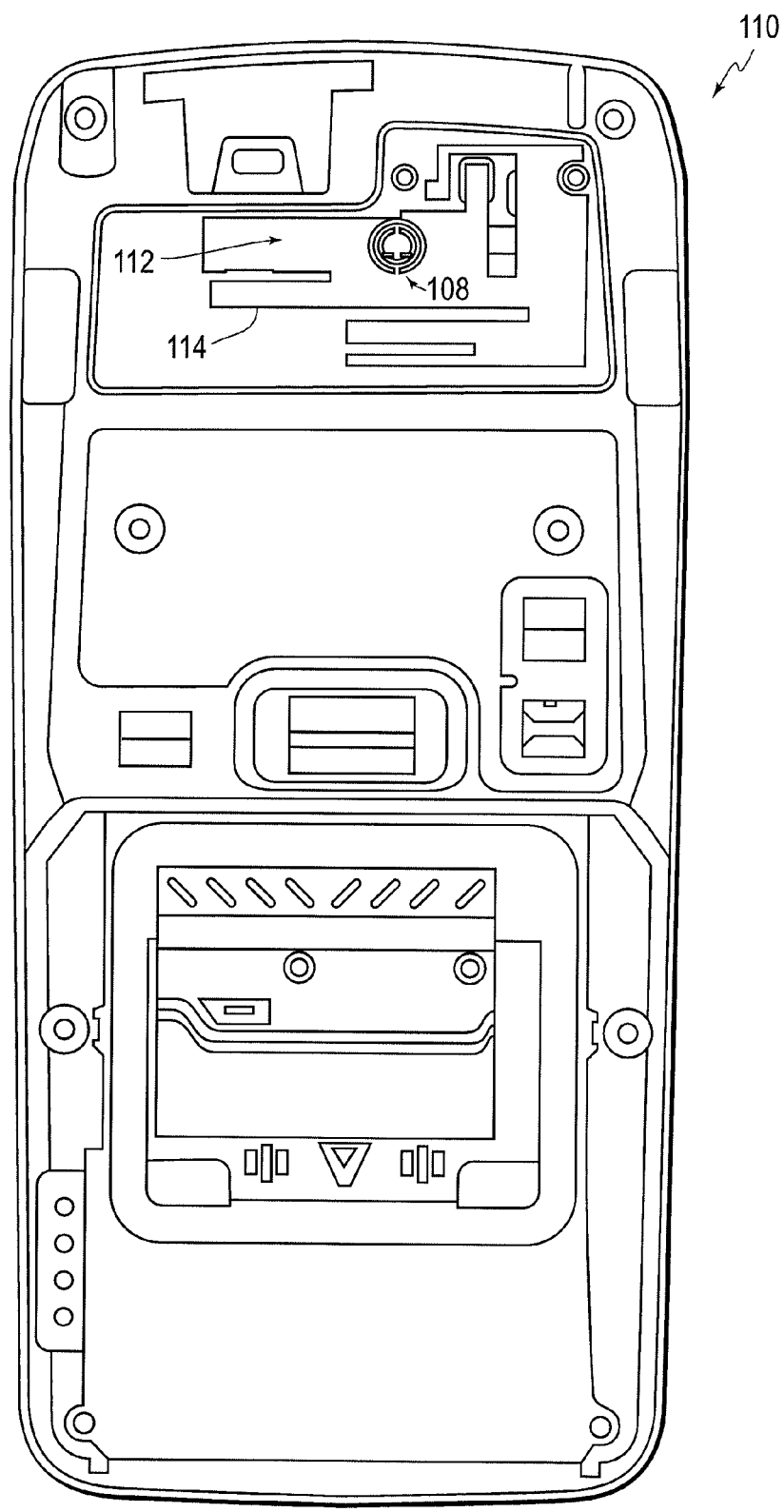
FIG. 6 is a diagram illustrating a receive antenna in combination with a device under test in accordance with an embodiment.

In operation, by measuring the received power detected by one or more of the receive antennas 108, resonant changes or detuning may be determined as described herein. The amount of detuning varies based on the properties of the material in proximity to the receive antenna 108 within the near field, which in various embodiments, is the reactive near field 400 (shown in FIG. 4). To determine the detuning, the one or more antennas 108 may be positioned in proximity to the device 110 and also may be moved to cover different areas of interest 112, such as if the object (e.g., antenna) to be detected is larger than the array of receive antennas 108. Thus, one or more probes 300 (shown in FIG. 3) formed from one or more receive antennas 108 each may be positioned in stationary relationship to the device 100 and then moved after each area of interest 112 is scanned. As illustrated in FIG. 6, a single receive antenna 108 may be used to measure received power to determine the resonant changes or detuning. For example, the receive antenna 108 may be scanned across the area of interest 112. The scanning may be performed manually (e.g., moved by a user) or automatically, such as when the receive antenna 108 is part of a movable structure (e.g., a moveable probe support).

In one or more embodiments, the transmit circuit (shown in FIG. 2) is driven to generate a probe antenna field having a strength that allows for detection of the transitions in the structure to be detected within the device 110 under test. For example, the device 110 may be a mobile computing device, such as an Intermec mobile computer available from Honeywell Scanning and Mobility. However, the testing system 100 may be used to test for structures in any other device, such as devices having antenna structures therein that are not visible once installed. The driven probe allows for the receive antenna 108 to detect, for example, the coupled power that is attempting to be delivered (coupled power in full resonance). In a radio application, antenna resonance may be characterized by Return Loss or S11, where the S11 S-parameters describe the input-output relationship between or for a port in an electrical system. When antenna is at its full resonance, Return Loss is at minimum value. Thus, when measuring S11 of each receive antenna within the device 110, the testing system 100 can determine the approximate shape of the structure within the device 110 without powering on the device 110. For example, when the device 110 includes a radio antenna as the object of interest, S11 of each receive antenna can be used to detect the transitions on the radio antenna (e.g., transitions between metal and non-metal portions) and therefore used to determine the approximate shape of the radio antenna.

Figure 7:
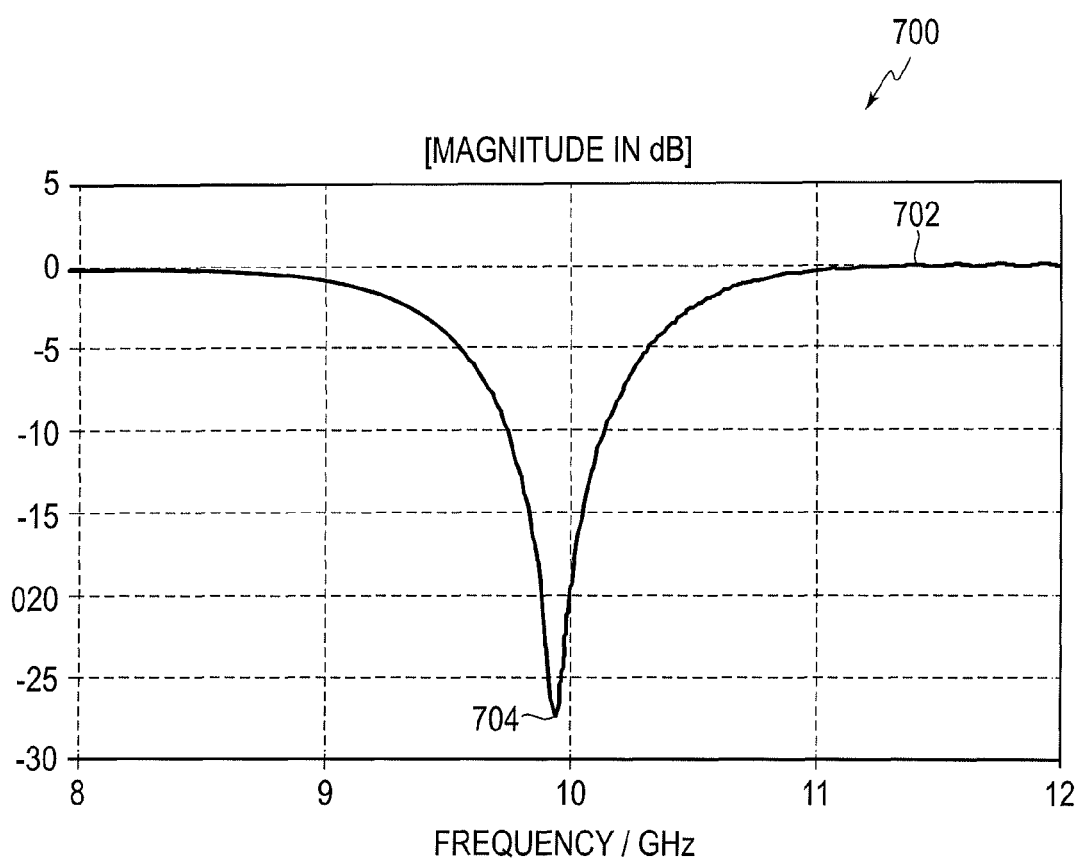
FIG. 7 is a graph illustrating a Return Loss or S11 of a receive antenna in free space, measured by a Vector Network Analyze.

For example, the graph 700 shown in FIG. 7 illustrates a S11 curve 702 that may be detected by one or more of the receive antennas 108. In the graph 700, the horizontal axis represents frequency in GHz and the vertical axis represents magnitude in decibels (dB). The curve 702 has a profile that may be used to determine resonant changes or detuning caused by structures within proximity (e.g., within 1-10 millimeters) to one or more of the receive antennas 108. For example, a change in the shape (e.g., location of valley 704) of the curve 702 representative of a change in received power or a location of the curve 702 representative of a frequency shift may be used to determine the resonant changes or detuning caused by the material within the device 110 in proximity to the receive antennas 108. For example, different materials will cause different known detuning effects, which then may be used to reconstruct an approximate shape of the structure causing the detuning detected by the receive antennas 108.

Figure 8:
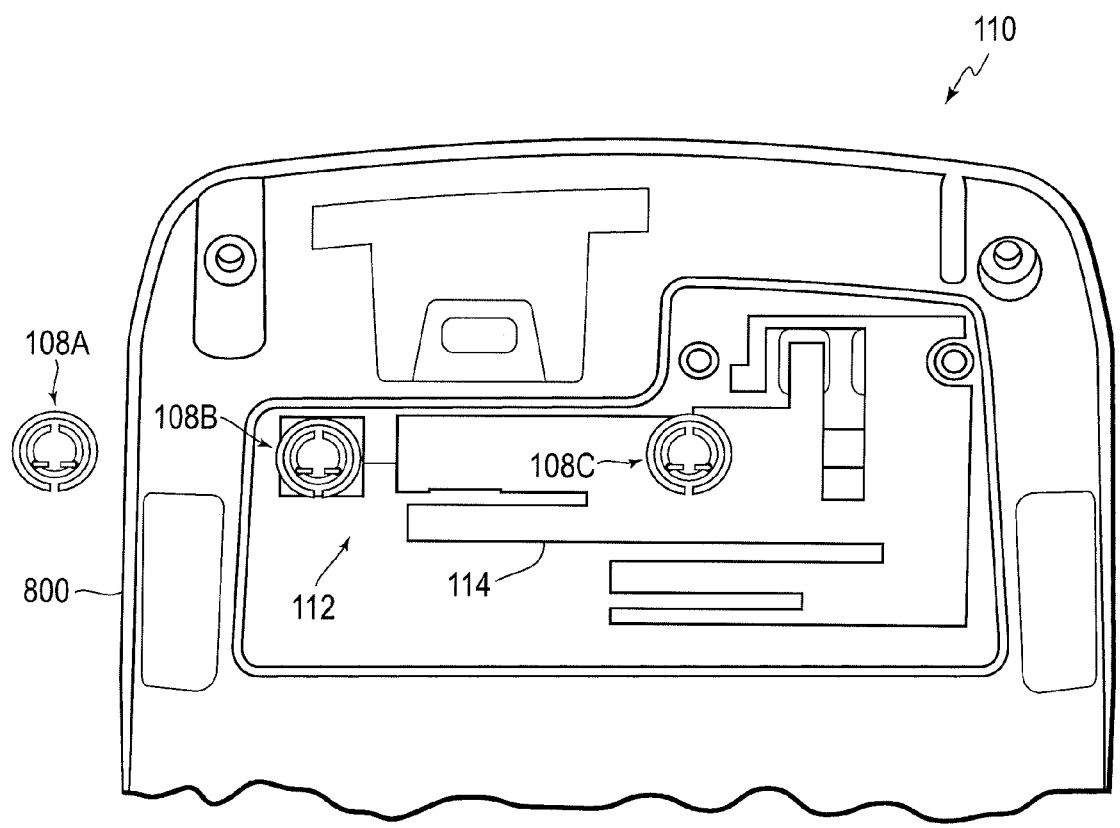
FIG. 8 is a diagram illustrating Return Loss of receive antennas at different locations of a device under test in accordance with an embodiment.

For example, as illustrated in FIG. 8 one of the receive antennas 108a may be located outside of the footprint of the device 110 (e.g., not in proximity to or abutting the housing 800 of the device 110), such as in free space. In this example, one of the receive antennas 108b may be located within the footprint of the device 110, and within the area of interest 112, but not in proximity to the structure of interest (the antenna 114 in this example), such as the polycarbonate material from which the housing 800 is formed and in which the antenna 114 is located. Additionally, in this example, one of the receive antennas 108c is located within the area of interest 112 and in proximity to the structure of interest (the antenna 114 in this example), which may be formed of copper (e.g., copper traces on a printed circuit board within the housing 800 and not visible to a user). Thus, in this example, the receive antennas 108a-108c may be positioned in proximity to free space, polycarbonate material, and copper on or within polycarbonate material. It should be noted that the location and spacing of the receive antennas 108 are for illustration of this example, and different locations and numbers of receive antennas 108 may be used as described herein.

In operation, when the transmit antenna 104 is activated, the receive antennas 108a-108c detect coupled power from each of the regions causing detuning effects to the respective receive antenna 108a-108c. It should be noted that when reference is made herein to on object being in proximity to a receive antenna 108, this generally refers to the object being within a distance of the receive antenna 108 such that the receive antenna 108 is capable of measuring the detuning effect by the object. In some embodiments, the receive antennas 108 are positioned such that no overlap of received signals from areas within the device 110 exists. However, in other embodiment, overlap of the received signals may exist.

Figure 9:
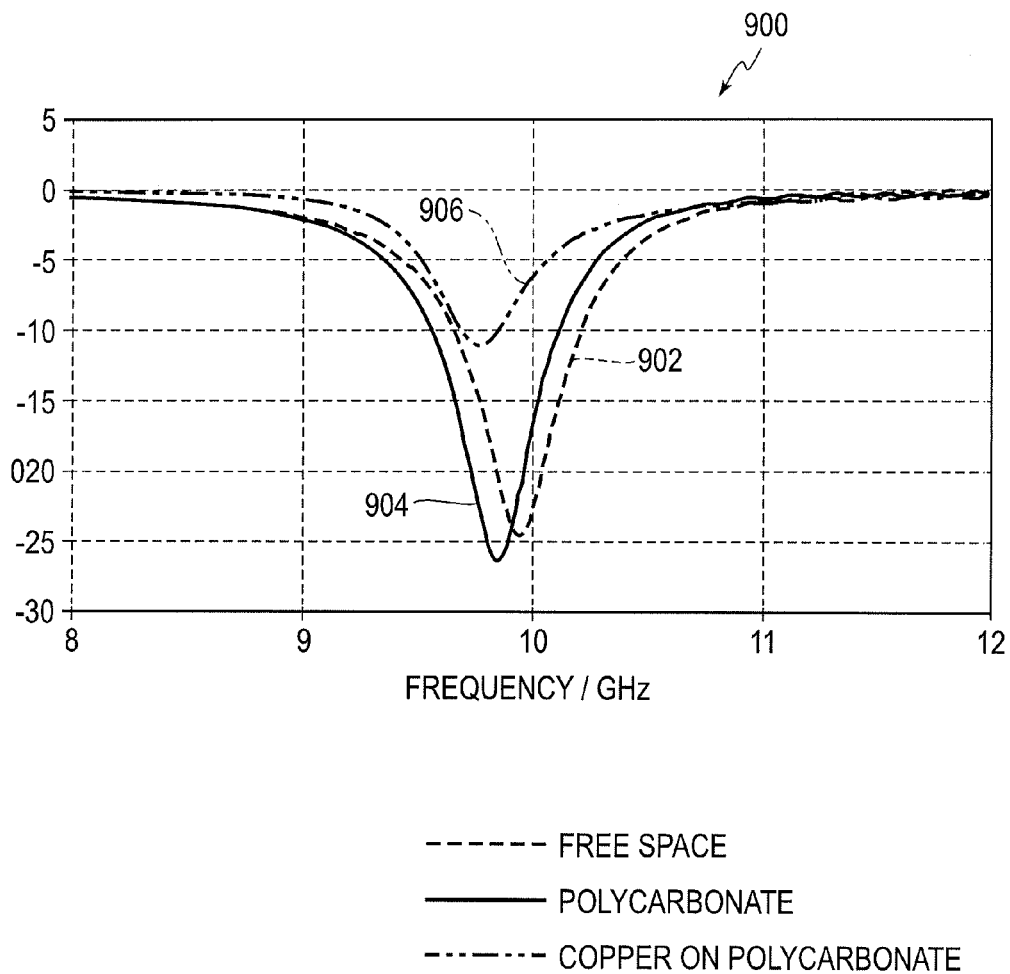
FIG. 9 is a graph illustrating Return Loss measured at the different locations of FIG. 8.

The graph 900 shown in FIG. 9 illustrates S11 curves 902, 904 and 906 corresponding to the antenna resonance coupled signals of the receive antennas 108a, 108b and 108c, respectively. In the graph 900, the horizontal axis represents frequency in GHz and the vertical axis represents magnitude in decibels (dB). The curves 902, 904 and 906 may be used to determine resonant changes or detuning caused by structures in proximity to the receive antennas 108*a*, 108*b* and 108*c*. For example, the curve 902 corresponds to the resonance or detuning of the receive antenna 108*a*. Thus, the curve 902 corresponds to a signal profile for antenna resonance, in this example, for free space. The frequency response or S11 defined by the curve 902 may be used to identify regions having no material in proximity to one or more receive antennas 108. The curve 904 corresponds to a signal profile for antenna resonance, in this example, in proximity of a polycarbonate material. The frequency response and S11 defined by the curve 904 may be used to identify regions having a polycarbonate material in proximity to one or more receive antennas 108. As can be seen, the curve 904 is frequency shifted with respect to the curve 902, as well as having a different resonance. The frequency shift and change in S11 is a result of the difference in the polycarbonate material versus free space, which can be used to determine resonance changes or detuning.

Similarly, the curve 906 corresponds to a signal profile for antenna resonance, in this example, for a copper material. The frequency response defined by the curve 906 may be used to identify regions having a copper material in proximity to one or more receive antennas 108. As can be seen, the curve 906 is frequency shifted with respect to the curves 902 and 904, as well as having a resonance. The frequency shift and change in S11 is a result of the difference in the copper material versus the polycarbonate material and free space, which can be used to determine resonance changes or detuning. Thus, as should be appreciated, different detuning effects are caused by different materials as evidenced by the frequency shifts and change in S11 between the curves 902, 904 and 906.

The measured power from the receive antennas 108 are "electromagnetically coupled" from the transmit antenna 104. The better the resonance of the receive antenna (therefore the deeper the resonance in Return Loss or S11 chart), the higher the coupled power from the receive antenna 108. When in proximity to dielectric or metallic materials, the receive antennas 108 will be detuned, therefore received power will be lower than when antennas are in full resonance in Free Space.

It should be noted that the Return Loss or S11 graph is a pure antenna measurement using a Vector Network Analyzer. It is a direct measurement of the antenna resonance, by injecting power to an antenna and measuring the ratio of the reflected power over injected power on the same antenna. Thus, S11 graphs as illustrated herein show the antenna detuning effect when in proximity to various materials.

In various embodiments, using the determined locations of different materials based on the different known detuning effects, an approximate shape of the structure causing the detuning detected by the receive antennas 108 may be determined. For example, using plural receive antennas 108, and knowing the material corresponding to the detuning effect measured by each of the receive antennas 108, as well as the locations of the receive antennas 108, allows for a rough or approximate determination of the shape of different materials causing the detuning.

Figure 10A:
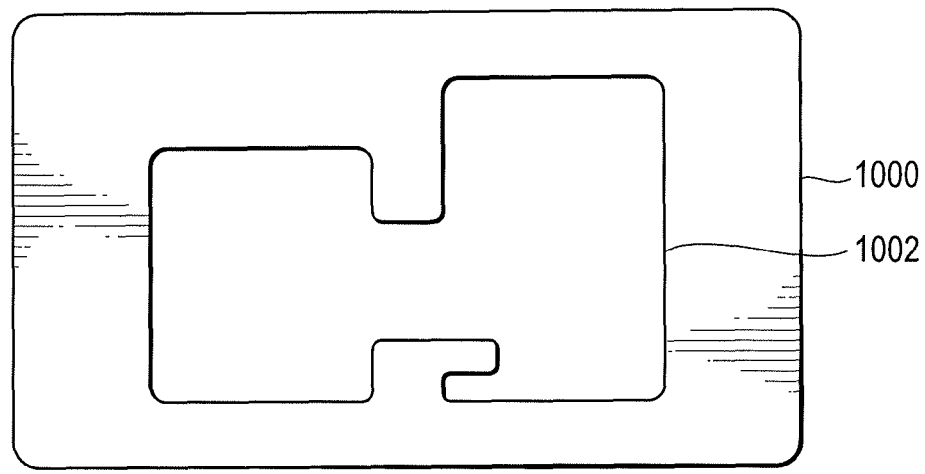
FIGS. 10A and 10B illustrate displays of approximate shapes of structures determined in accordance with an embodiment.
Figure 10B:
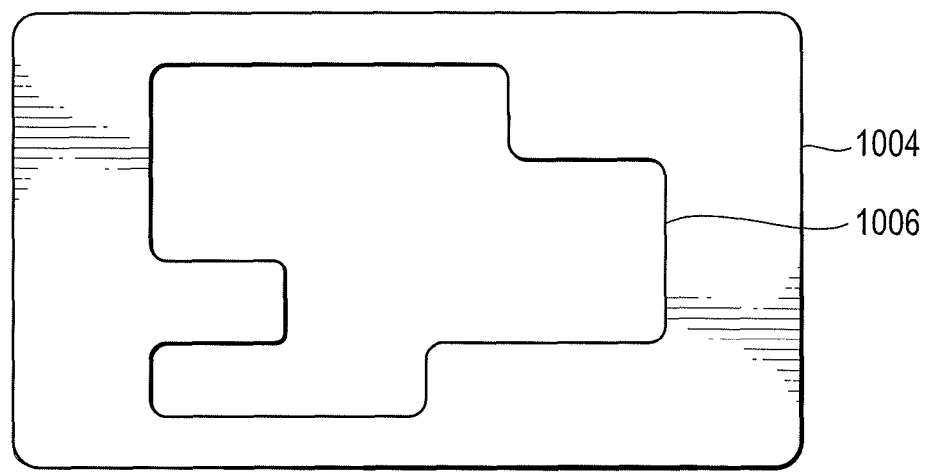

Thus, for example, as shown in FIG. 10, a display 1000 illustrates a shape 1002 determined by identified metallic regions based on measured detuning and the display 1004 illustrates a shape 1006 determined by identified metallic regions based on measured detuning. As can be seen, while the shapes 1002 and 1004 are rough in dimensions, using a matching template or by visual comparison, the shapes 1002 and 1004 may be matched to known shapes of antennas (e.g., European and U.S. antennas). For example, while the shapes 1002 and 1004 may not be exact representations of the structures, the differences between the shapes 1002 and 1004 provide enough detail to distinguish between different types of antennas. It should be noted that one or more shape features may be searched for to match the shapes 1002 and 1004 with particular antenna shapes.

Figure 11:
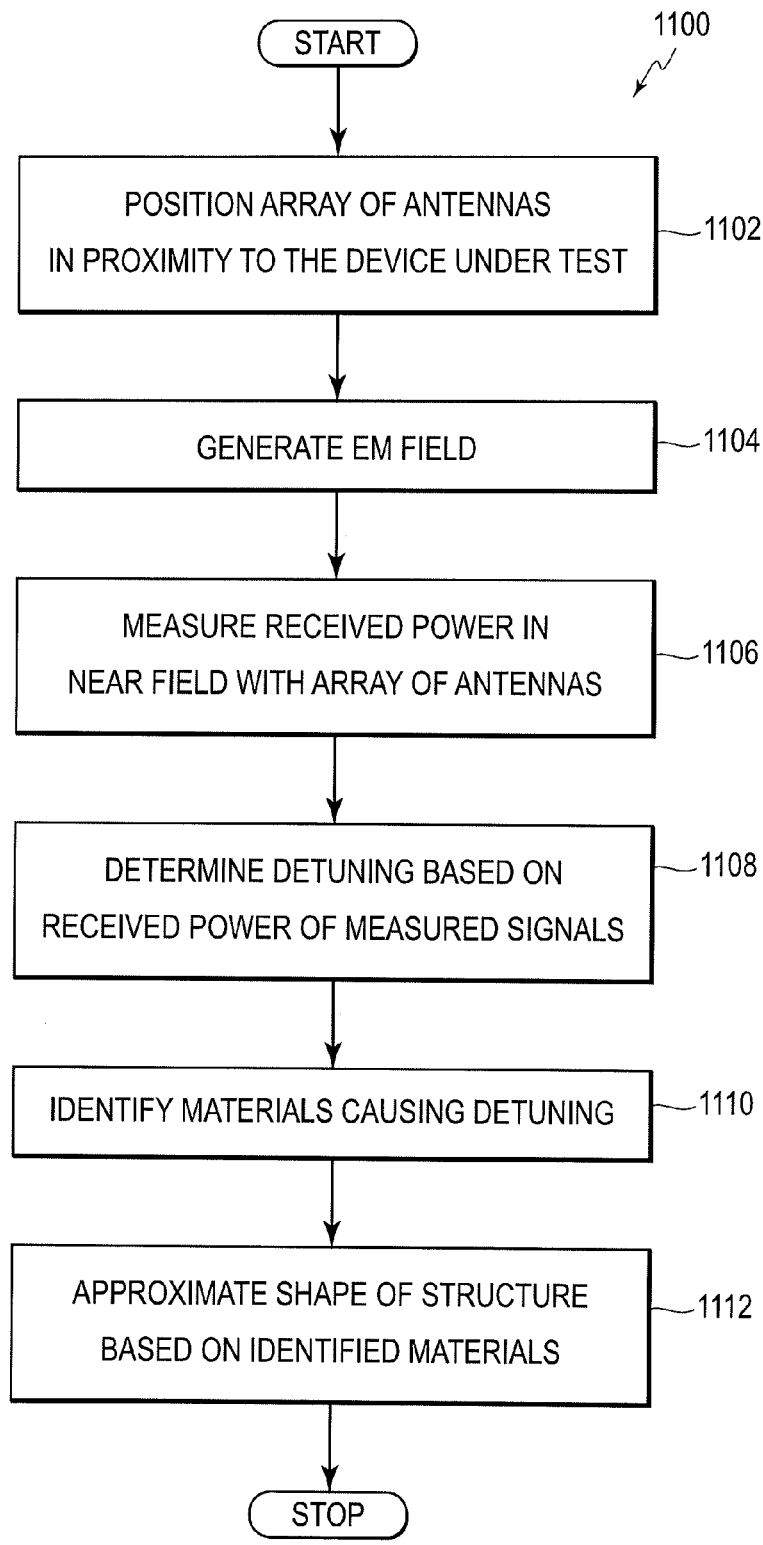
FIG. 11 illustrates a method for approximating a shape of a structure in accordance with an embodiment.

One or more embodiments include a method 1100 as illustrated in FIG. 11. With reference also to FIGS. 1-10, the method 1100 may be implemented or performed using one or more systems described herein, such as the testing system 100. The method 1100 includes positioning an array of antennas in proximity to a device under test at 1102. For example, the receive antennas 108 may be positioned in proximity to a housing of a mobile computing device (e.g., adjacent a back surface of the mobile computing device adjacent an antenna therein). The method 1100 also includes generating an EM field at 1104. For example, the transmit antenna 104 may be used to generate an EM field as described herein.

The method 1100 includes measuring received power in receive antenna coupled signals in the near field with the array of antennas at 1106. In various embodiments, each of the receive antennas measures power of coupled signals in proximity to the respective receive antenna. A detuning based on the received power of the measured signals is determined at 1108. For example, change in magnitude of received power or frequency shift in the resonance coupled signals may be used to determine the detuning as described herein.

The method 1100 includes identifying materials causing the detuning at 1110. The identification of materials may be determined based on known detuning effects caused by different materials. Once the different materials are identified and based on the location of the receive antenna detecting the power of coupled signals, an approximate shape of a structure based on the identified materials may be determined at 1112. For example, the rough shape of an antenna within a housing may be determined.

Thus, by measuring received power using one or more receive antennas, various embodiments determine resonance changes specific to a material having a particular shape of a structure, such as a particular shape of an antenna.

It should be noted that the testing system 100 can comprise one or more microprocessor (which may be embodied as the processor 118) and a memory, such as the memory 120, coupled via a system bus. The microprocessor can be provided by a general purpose microprocessor or by a specialized microprocessor (e.g., an ASIC). In one embodiment, the testing system can comprise a single microprocessor which can be referred to as a central processing unit (CPU). In another embodiment, the testing apparatus 100 can comprise two or more microprocessors, for example, a CPU providing some or most of the testing functionality and a specialized microprocessor performing some specific functionality. A skilled artisan would appreciate the fact that other schemes of processing tasks distribution among two or more microprocessors are within the scope of this disclosure. The memory can comprise one or more types of memory, including but not limited to: random-access-memory (RAM), non-volatile RAM (NVRAM), etc.

It should be noted that, for example, the antennas detected by the testing system 100 can provide communication using different standards and protocols, and as such, may have different shapes and configurations. For example, the wireless communication can be configured to support, for example, but not limited to, the following protocols: at least one protocol of the IEEE 802.11/802.15/802.16 protocol family, at least one protocol of the HSPA/GSM/GPRS/EDGE protocol family, TDMA protocol, UMTS protocol, LTE protocol, and/or at least one protocol of the CDMA/1xEV-DO protocol family.

The flowcharts and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The corresponding structures, materials, acts, and equivalents of any means or step plus function elements in the claims below are intended to include any structure, material, or act for performing the function in combination with other claimed elements as specifically claimed. The description of the present disclosure has been presented for purposes of illustration and description, but is not intended to be exhaustive or limited to embodiments in the form disclosed. Many modifications and variations will be apparent to those of ordinary skill in the art without departing from the scope and spirit of embodiments of the disclosure. The embodiments were chosen and described in order to best explain the principles of embodiments and practical application, and to enable others of ordinary skill in the art to understand embodiments with various modifications as are suited to the particular use contemplated.

The foregoing descriptions of specific embodiments have been presented for purposes of illustration and description. They are not intended to be exhaustive or to limit the embodiments to the precise forms disclosed, and obviously many modifications and variations are possible in light of the above teaching. The embodiments were chosen and described in order to best explain principles and practical applications thereof, and to thereby enable others skilled in the art to best utilize the various embodiments with various modifications as are suited to the particular use contemplated. It is understood that various omissions and substitutions of equivalents are contemplated as circumstances may suggest or render expedient, but these are intended to cover the application or implementation without departing from the spirit or scope of the claims. The following claims are in no way intended to limit the scope of embodiments to the specific embodiments described herein.

What is claimed is:

1. A method for determining a shape of a structure, the method comprising:
    measuring received power of coupled signals from a receive antenna based on a transmit signal from a transmit antenna, the coupled signal power measured in an electromagnetic (EM) near field;
    determining detuning effects from the received coupled signal power;
    identifying materials in a device causing the detuning effects; and
    approximating a shape of the structure of interest in the device using the identified materials in the device.

2. The method of claim 1, further comprising using a location of a plurality of receive antennas that measure the received power to determine a location of the identified materials.

3. The method of claim 1, further comprising performing a shape match using the approximated shape from the approximating step with an expected shape.

4. The method of claim 1, further comprising displaying the shape from the approximating step.

5. The method of claim 1, further comprising changing a location of an array of receive antennas to measure different in antenna resonance.

6. The method of claim 1, wherein determining the detuning effects comprises using a frequency shift of the antenna resonance.

7. A non-transitory computer-readable storage medium comprising executable instructions capable of configuring one or more processors for:
    measuring received power of coupled signals from a receive antenna in proximity to the structure of interest based on a transmit signal from a transmit antenna, the coupled signals measured in an electromagnetic (EM) near field;
    determining detuning effects based on the received power of the coupled signals;
    identifying materials in a device causing the detuning effects; and
    approximating a shape of the structure of interest in the device using the identified materials in the device.

8. The non-transitory computer-readable storage medium of claim 7, in which the executable instructions are further capable of configuring one or more processors to use a location of a plurality of receive antennas that measure the coupled signals to determine a location of the identified materials.

9. The non-transitory computer-readable storage medium of claim 7, in which the executable instructions are further capable of configuring one or more processors to perform a shape match using the approximated shape from the approximating with an expected shape.

10. The non-transitory computer-readable storage medium of claim 7, in which the executable instructions are further capable of configuring one or more processors to display the shape from the approximating.

11. The non-transitory computer-readable storage medium of claim 7, in which the executable instructions are further capable of configuring one or more processors to determine the detuning using a frequency shift of the antenna resonance.

12. A system comprising:
    at least one receive antenna configured for measuring received power of coupled signals from a receive antenna in proximity to the structure of interest based on a transmit signal from a transmit antenna, the coupled signals measured in an electromagnetic (EM) near field; and
    a processor configured to:
        determine detuning effects based on the received power of the coupled signals, wherein materials are identified in a device causing the detuning effects; and approximating a shape of the structure of interest in the device using the identified materials in the device.

13. The system of claim 12, wherein the processor is further configured to uses a location of a plurality of receive antennas that measure the coupled signals to determine a location of the identified materials.

14. The system of claim 12, wherein the processor is further configured to perform a shape match using the approximated shape from the approximating with an expected shape.

15. The system of claim 12, wherein the processor is further configured to cause a display to display the shape from the approximating.

16. The system of claim 12, wherein the processor is further configured to determine the detuning using a frequency shift of the antenna resonance.

17. The system of claim 12, wherein the at least one receive antenna comprises plural antennas arranged in an array and the structure within the device is a device antenna, the processor further configured to determine the approximate shape of the device antenna and identify a type of the device antenna using the determined approximate shape.

18. The system of claim 12, wherein the processor further configured determine the approximate shape of the structure using received power information and frequency shift information,
wherein the processor is configured to use the received power information and frequency shift information to determine one or more materials of the structure.

19. The system of claim 12, further comprising a display configured to display a visual representation of the structure within the device under test.

20. The system of claim 12, wherein the transmit antenna and the at least one receive antenna are part of a single antenna element.

* * * * *